(12) United States Patent
Peng et al.

(10) Patent No.: US 8,237,132 B2
(45) Date of Patent: Aug. 7, 2012

(54) METHOD AND APPARATUS FOR REDUCING DOWN TIME OF A LITHOGRAPHY SYSTEM

(75) Inventors: Jui-Chun Peng, Hsin-Chu (TW);
 Heng-Jen Lee, Baoshan Township, Hsinchu County (TW); Tung-Li Wu, Hsinchu (TW); I-Hsiung Huang, Hukuo Shiang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 551 days.

(21) Appl. No.: 12/486,565

(22) Filed: Jun. 17, 2009

(65) Prior Publication Data

US 2010/0321660 A1 Dec. 23, 2010

(51) Int. Cl.
 *G21K 5/00* (2006.01)
(52) U.S. Cl. .............. 250/492.1; 250/493.1; 250/504 R; 356/51
(58) Field of Classification Search ............... 250/492.1, 250/492.2, 493.1, 503.1, 504 R; 356/51
 See application file for complete search history.

(56) References Cited

U.S. PATENT DOCUMENTS

| | | | | |
|---|---|---|---|---|
| 2006/0131515 | A1* | 6/2006 | Partlo et al. ............. | 250/504 R |
| 2007/0187627 | A1* | 8/2007 | Ershov et al. ............ | 250/504 R |
| 2008/0043321 | A1* | 2/2008 | Bowering et al. ........ | 359/359 |
| 2008/0088900 | A1* | 4/2008 | Hie et al. ................. | 359/201 |
| 2008/0237498 | A1 | 10/2008 | MacFarlane | |
| 2009/0289205 | A1* | 11/2009 | Moriya et al. ........... | 250/504 R |
| 2010/0019173 | A1* | 1/2010 | Someya et al. .......... | 250/496.1 |

OTHER PUBLICATIONS

Akira Endo et al., "CO2 Laser and Sn Droplet Target Development for EUVL", EUVL, 1 page.
Akira Endo et al., "CO2 Laser-Produced Sn-Plasma Source for Hign-Volume Manufacturing EUV Lithography", The Smithsonian/NASA Astrophysics Data System, http://adsabs.harvard.edu/abs/2008SPIE.6921E...24E, 1 page.
David Brandt et al., "LPP EUV Source Development for HVM", 10 pages.

* cited by examiner

*Primary Examiner* — David A Vanore
*Assistant Examiner* — Nicole Ippolito
(74) *Attorney, Agent, or Firm* — Haynes and Boone, LLP

(57) ABSTRACT

An apparatus includes a radiation source that emits a radiation beam that causes substantially all of a quantity of material to evaporate; and structure having first and second surface portions, a first operational mode wherein a greater quantity of a byproduct of the evaporation impinges on the first surface portion, and a second operational mode wherein a greater quantity of the byproduct impinges on the second surface portion. A different aspect involves emitting a radiation beam toward a quantity of material, the radiation beam causing substantially all of the quantity of material to evaporate; operating a structure having first and second surface portions in a first operational mode wherein a greater quantity of a byproduct of the evaporation impinges on the first surface portion; and thereafter operating the structure in a second operational mode wherein a greater quantity of the byproduct impinges on the second surface portion.

20 Claims, 3 Drawing Sheets

METHOD AND APPARATUS FOR REDUCING DOWN TIME OF A LITHOGRAPHY SYSTEM

BACKGROUND

This disclosure relates in general to lithography systems, and more particularly, to techniques for maintaining components of a lithography system.

During the operation of a $CO_2$ laser in a conventional extreme ultraviolet (EUV) lithography system, a radiation pulse is emitted by the $CO_2$ laser. The radiation pulse strikes a tin droplet, and upon striking the tin droplet, the radiation pulse transforms into a radiation portion having a different wavelength that is in the EUV spectrum. Further, upon striking the droplet, the radiation pulse evaporates substantially all of the droplet. However, if the radiation pulse does not evaporate all of the droplet, then a byproduct is produced. The byproduct travels toward the reflective surface of a collector mirror, and impinges on the reflective surface. Over time, the byproduct collects on the reflective surface, and/or may damage the reflective surface.

In a conventional EUV lithography system, once a certain amount of byproduct collects on the reflective surface, or after the byproduct causes a certain amount of damage to the reflective surface, the collector mirror must be replaced. Replacement of the collector mirror can constitute up to 90% of the repair and maintenance costs of an EUV lithography system. Further, replacement of a collector mirror may take as long as four days, and the EUV lithography system is inoperable during that time. Although this preexisting approach has been generally adequate for its intended purposes, it has not been satisfactory in all respects.

SUMMARY

One of the broader forms of the invention involves an apparatus having: a material source configured to provide a quantity of a material; a radiation source configured to emit a radiation beam that strikes the quantity of material, causing substantially all of the quantity of material to evaporate; and structure having first and second surface portions, and having first and second operational modes, wherein in the first operational mode a greater quantity of a byproduct of the evaporation impinges on the first surface portion than on the second surface portion, and in the second operational mode a greater quantity of the byproduct impinges on the second surface portion than on the first surface portion.

According to another of the broader forms of the invention, a method includes: emitting a radiation beam toward a quantity of material; striking the quantity of material with the radiation beam, causing substantially all of the quantity of material to evaporate; operating a structure having first and second surface portions in a first operational mode in which a greater quantity of a byproduct of the evaporation impinges on the first surface portion than on the second surface portion; and thereafter operating the structure in a second operational mode in which a greater quantity of the byproduct impinges on the second surface portion than on the first surface portion.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to an extreme ultraviolet (EUV) lithography system, and more particularly, to an EUV laser. It is understood, however, that specific embodiments are provided as examples to teach the broader inventive concept, and one of ordinary skill in the art can easily apply the teaching of the present disclosure to other methods or apparatus. Also, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings.

Figure 1:
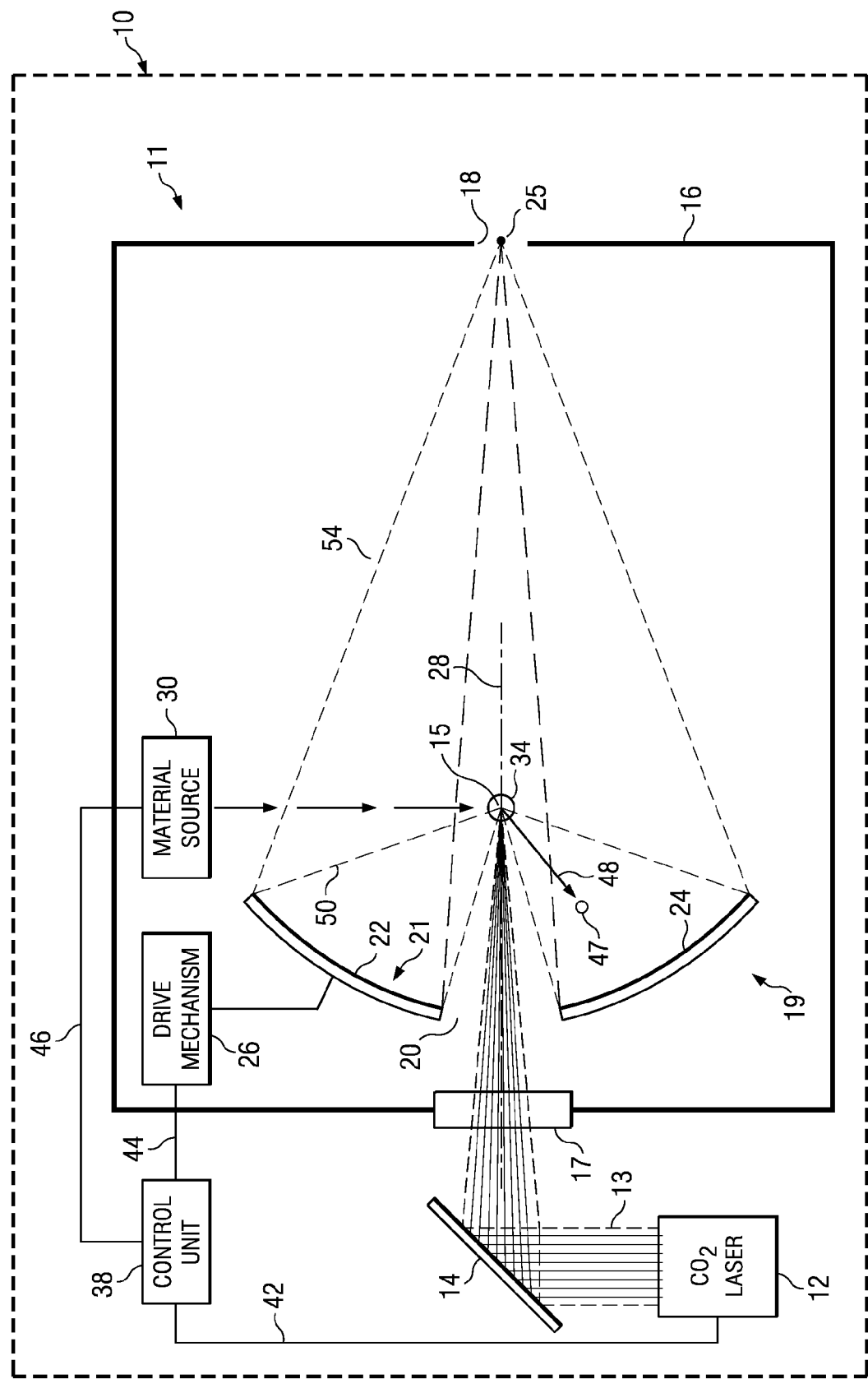
FIG. 1 is a diagrammatic sectional side view of an extreme ultraviolet ("EUV") lithography system.

FIG. 1 is a diagrammatic sectional side view of an EUV lithography system 10. The EUV lithography system 10 includes an EUV laser 11. A $CO_2$ laser 12 is a component of the EUV laser 11. Upon receiving a trigger pulse, the $CO_2$ laser 12 emits a focused radiation pulse 13 having a wavelength of approximately 10.6 µm. The $CO_2$ laser 12 is a known component in the art, and the structure of the $CO_2$ laser 12 is not described herein in detail. In the embodiment shown in FIG. 1, the $CO_2$ laser 12 is an axial-flow RF-pumped Master Oscillator Power Amplifier ("MOPA") configuration with multiple stages of amplification. However, other $CO_2$ laser configurations may be used in place of the $CO_2$ laser 12.

The $CO_2$ laser 12 directs the radiation pulse 13 toward a mirror 14. The mirror is positioned at about a 45 degree angle with respect to the path of the radiation pulse 13. Upon striking the mirror 14, the radiation pulse 13 is reflected at an approximately 90 degree angle along a path that extends toward a focal point located at an impact location 15 within a housing 16. The $CO_2$ laser 12 and the mirror 14 are both positioned external to the housing 16.

The chamber of the housing is maintained under a vacuum by a vacuum pump (not shown). The vacuum pump progressively draws out a gaseous mixture. The vacuum pump is capable of evacuating the chamber to approximately $10^{-6}$ Pa.

A side of the housing 16 that faces the mirror 14 has a window 17 that is transmissive to the radiation pulse 13, and has no optical power. The path of the radiation pulse 13 passes through the window 17. On the side opposite the window 17, the housing 16 has an aperture 18.

Within the chamber of the housing 16, there is a collector mirror 19. The collector mirror 19 includes an aperture 20 and a continuous reflective surface 21. The aperture 20 is located approximately at the center of the surface 21, and extends from the surface 21 to a back surface of the collector mirror that faces the window 17.

The surface 21 includes a reflective surface portion 22 and a reflective surface portion 24. Further, the surface 21 is ellipsoidal, and is shaped to focus radiation to a focal point 25.

Alternatively, the continuous surface 21 could have various other shapes that are suitable for this application.

The continuous reflective surface 21 is super-polished and coated in a known manner using a known deposition tool and a known technology that is based on direct current (DC) magnetron sputtering that is compatible with large-area collector coating. Further, the continuous reflective surface 21 is coated with a graded high-temperature-stable coating with interface-engineered multi-layers to provide high EUV reflectivity at varying angles of incidence. The coating includes approximately 500 sacrificial layers, while still providing full EUV reflectivity. With respect to EUV radiation, the coating acts as a spectral purity filter that only reflects light having a wavelength that is approximately 13.5 nm.

A drive mechanism 26 is coupled to the collector mirror 19. The drive mechanism 26 supports the collector mirror 19 for movement. The movement includes rotation of the collector mirror 19 about an axis 28. The axis 28 passes through the aperture 20 and the window 17. Further, the axis 28 is coincident with the path of the radiation pulse 13 after it has been reflected by the mirror 14. The axis 28 is also coincident with the major axis of the ellipsoidal surface 21. The drive mechanism 26 is capable of rotating the collector mirror 19 any number of degrees clockwise and/or counterclockwise.

The EUV laser 11 also includes a material source 30, which is positioned inside the chamber of the housing 16. In other embodiments, the material source 30 may be replaced with a material source that is located external to the housing. The material source 30 holds a material. The material of the embodiment shown in FIG. 1 is tin. However, in other embodiments, the material source 30 may be replaced with a material source that holds a different material, including $SnH_4$ and Indium. Upon receiving a trigger pulse, the material source 30 releases a quantity of material 34, which falls to the impact location 15. The quantity of material is a droplet having a diameter of approximately 40 to 150 µm. In another embodiment, the droplet may be a droplet that has a diameter of approximately 17 µm.

The material source 30 provides tin droplets at a rate of approximately 18 to 402 kHz. In another embodiment, the material source 30 is replaced with a material source that releases droplets at a controllable frequency in the approximately 20 to 200 kHz range. In yet another embodiment, the material source 30 is replaced with a material source that includes a 10 µm nozzle, which enables the material source to generate 17 µm diameter droplets at a 550 kHz repetition rate.

A control unit 38 is coupled to the $CO_2$ laser 12 via a control line 42, to the drive mechanism 26 via a control line 44, and to the material source 30 via a control line 46.

The operation of the EUV laser 11 of FIG. 1 will now be described. The control unit 38 controls the operation of various components of the EUV laser 11. For example, the control unit 38 triggers the emitting of the radiation pulse 13 by the $CO_2$ laser.

Furthermore, the control unit 38 controls the material source 30 via control line 46. The control unit 38 triggers the release of the quantity of material 34 that drops to the impact location 15. The control unit 38 also controls the timing of the emitting of the radiation pulse 13 and the release of the quantity of material 34 so that the quantity of material 34 and the radiation pulse 13 reach the impact location 15 at approximately the same time.

The EUV laser 11 has a first operational mode and a second operational mode. During the first operational mode, the $CO_2$ laser 12 emits a radiation pulse 13 toward the mirror 14. Upon striking the mirror 14, the radiation pulse 13 is directed along a path toward the window 17. The path is coincident with the axis 28. The path also passes through the window 17 and the aperture 20 of the collector mirror 19, and is directed toward the impact location 15. The surface portion 22 and the surface portion 24 are spaced from the path.

The radiation pulse 13 strikes the quantity of material 34 when it reaches the impact location 15. Upon striking the quantity of material 34, the radiation pulse 13 evaporates substantially all of the quantity of material 34. The vacuum pump (not shown) progressively draws the evaporated quantity of material 34 from the chamber of the housing 16.

Further, upon striking the quantity of material 34, the radiation pulse 13 transforms from a radiation pulse 13 having a wavelength of approximately 10.6 µm into a radiation portion 50 having a wavelength that is in the EUV spectrum (approximately 13.5 nm). A plasma front with highly excited species is formed when the radiation pulse 13 strikes the quantity of material 34, and the radiation portion 50 includes 13.5 nm wavelength photons that are radiated by the plasma front in a plurality of directions.

The radiation portion 50 radiates toward the continuous surface 21. When the radiation portion 50 strikes the continuous surface 21, the continuous surface 21 reflects the radiation portion 50, and focuses the reflection of the radiation portion 50 toward the focal point 25. One ray of the focused radiation is identified by reference numeral 54.

If the radiation pulse 13 does not evaporate all of the quantity of material 34, then a byproduct 47 is produced. The byproduct 47 includes high-energy ions, neutral atoms and/or clusters of target material. The byproduct 47 travels toward the surface portion 24 in a direction shown by arrow 48. Other byproduct portions (not shown) travel in other directions. Upon reaching the surface portion 24, the byproduct 47 impinges on the surface portion 24.

In the first operational mode, a greater quantity of the byproduct 47 impinges upon the surface portion 24 than on the surface portion 22. Over time, the byproduct 47 collects on the surface portion 24, and/or may damage the surface portion 24. After a predetermined amount of time, for example three months or a specified number of hours of laser operation, the control unit 38 sends a pulse to the drive mechanism 26, via control line 44. Upon receiving the pulse, the drive mechanism 26 initiates rotation of the collector mirror 19 about the axis 28. The drive mechanism 26 rotates the collector mirror 19 approximately 180 degrees, so that the surface portions 22 and 24 exchange positions. This is just one example of how the drive mechanism 26 may rotate the collector mirror 19, and it should be understood that the drive mechanism 26 may rotate the collector mirror 19 any number of degrees about the axis 28. In another embodiment, the control unit 38 may be replaced with a control unit that uses other criteria to determine when a collector mirror should rotate. For example, a control unit could monitor a collector mirror, and send the pulse to the drive mechanism 26 after a certain amount of byproduct has collected upon the surface portion 24, or after the surface portion 24 exhibits a certain level of physical damage.

After rotating the collector mirror 19, the second operational mode begins. The operation of the EUV laser 11 during the second operational mode is similar to the operation during the first operational mode described above. However, in the second operational mode, if the radiation pulse 13 does not evaporate all of the quantity of material 34, then the byproduct 47 impinges primarily upon the surface portion 22 instead of the surface portion 24 (because they have exchanged positions).

After a predetermined amount of time, the second operational mode ends. At the end of the second operational mode, byproduct 47 will have impinged upon each of the surfaces portions 22 and 24. At this time, operation of the EUV laser 11 is halted, and the collector mirror 19 is replaced with an identical collector mirror (not shown) that has a surface that is clean and undamaged.

Rotation of the collector mirror 19 may enable the collector mirror 19 to be used approximately more than 50% longer than a collector mirror used in a conventional EUV laser that does not rotate the collector mirror. Further, the repair and maintenance costs of the EUV laser 11 may be more than 40% less than a conventional EUV laser 11, because of the increased lifetime of the collector mirror 19 that results from the ability to rotate the collector mirror 19. In addition, the ability to rotate the collector mirror 19 may result in less downtime, because the collector mirror 19 does not have to be replaced as often as a collector mirror in an EUV laser that does not rotate the collector mirror. As the result, the EUV laser 11 may be at least 5% more productive than a conventional EUV laser that does not rotate the collector mirror.

Figure 2:
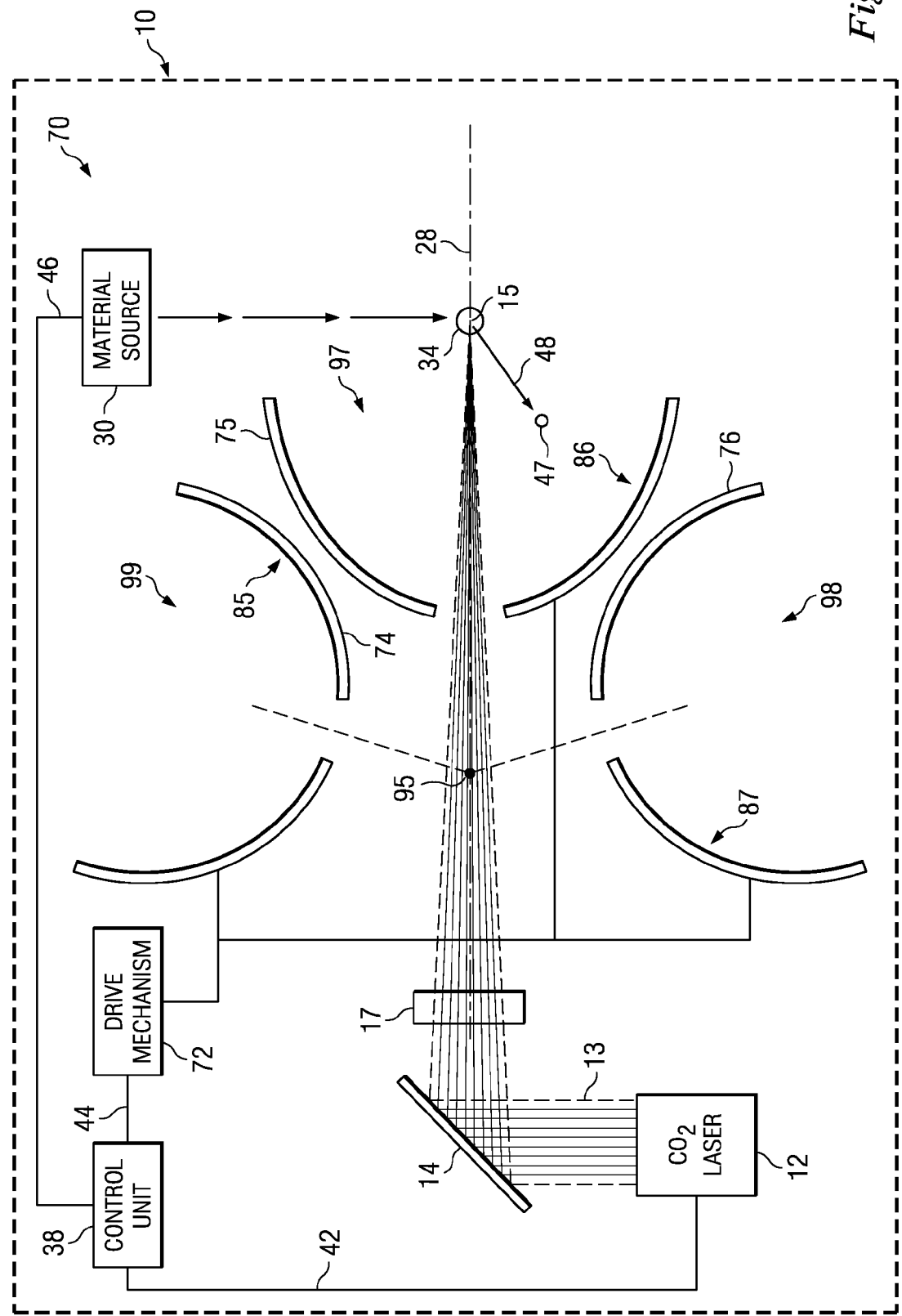
FIG. 2 is a diagrammatic sectional side view of a portion of an EUV laser that is an alternate embodiment of an EUV laser shown in FIG. 1.

FIG. 2 is a diagrammatic sectional side view of a portion of an EUV laser 70 that is an alternate embodiment of the EUV laser 11 shown in FIG. 1. Components in FIG. 2 that are identical or equivalent to components in FIG. 1 are identified with the same reference numerals. The discussion that follows will focus on the differences between the embodiments shown in FIGS. 1 and 2.

The EUV laser 70 includes three collector mirrors 74-76. Alternatively, however, the laser 70 could have a larger or smaller number of collector mirrors. In the embodiment shown in FIG. 2, each of the collector mirrors 74-76 is identical to the collector mirror 19 shown in FIG. 1, and includes a continuous surface 85-87 respectively.

Referring back to the embodiment shown in FIG. 2, a drive mechanism 72 supports each of the collector mirrors 74-76 for movement. The movement includes rotation of the collector mirrors 74-76 about an axis 95 that is perpendicular to the plane of FIG. 2, and that intersects axis 28. The axis 95 is also transverse to the path of the radiation pulse 13 after reflection by the mirror 14. The drive mechanism 72 is capable of simultaneously rotating all of the collector mirrors 74-76 any number of degrees clockwise and/or counterclockwise about the axis 95. In FIG. 2, the collector mirror 75 is at an active position 97, and the collector mirrors 74 and 76 are at respective inactive positions 99 and 98.

The operation of the EUV laser 70 of FIG. 2 will now be described. The EUV laser 70 includes three operational modes. In the first operational mode, collector mirror 74 begins at active position 97, and collector mirror 75 begins at inactive position 98. If the radiation pulse 13 does not evaporate all of the quantity of material 34 upon striking the quantity of material 34, then the byproduct 47 travels toward the surface 85 in a direction shown by arrow 48. Upon reaching the surface 85, the byproduct 47 impinges on the surface 85. In the first operational mode, the byproduct 47 impinges upon the surface 85, but not the surfaces 86-87.

After a predetermined amount of time, the control unit 38 sends a pulse to the drive mechanism 72, via control line 44. Upon receiving the pulse, the drive mechanism 72 initiates simultaneous rotation of the collector mirrors 74-76 about the axis 95. The drive mechanism 72 rotates all of the collector mirrors 74-76 counterclockwise, so that the collector mirror 74 moves to the inactive position 99, the collector mirror 75 moves to the active position 97, and the collector mirror 76 moves to the inactive position 98.

Once the collector mirrors 74-76 have rotated, the second operational mode begins. The operation of the EUV laser 70 during the second operational mode is similar to the operation during the first operational mode described above. However, in the second operational mode, if the radiation pulse 13 does not evaporate all of the quantity of material 34, then the byproduct 47 impinges upon the surface 86, but not the surfaces 85 and 87.

After a predetermined amount of time, the control unit 38 sends a pulse to the drive mechanism 72, via control line 44. Upon receiving the pulse, the drive mechanism 72 initiates rotation of the collector mirrors 74-76 about the axis 95. The drive mechanism 72 simultaneously rotates all of the collector mirrors 74-76 counterclockwise, so that the collector mirror 75 moves to inactive position 99, and the collector mirror 76 moves to active position 97.

Once the collector mirrors 74-76 have rotated, the third operational mode begins. The operation of the EUV laser 70 during the third operational mode is similar to the operation during the first and second operational modes described above. However, in the third operational mode, if the radiation pulse 13 does not evaporate all of the quantity of material 34, then the byproduct 47 impinges upon the surface 87, but not the surfaces 85 and 86.

After a predetermined amount of time, the third operational mode ends. At the end of the third operational mode, byproduct 47 will have impinged upon each of the surfaces 85-87. At this time, operation of the EUV laser 70 is halted, and each of the collector mirrors 74-76 are replaced with identical collector mirrors (not shown) that have surfaces that are clean and undamaged. In an alternate embodiment, the operation of the EUV laser 70 is not interrupted, and any collector mirror 74-76 that is positioned at an inactive position, such as inactive positions 98 and 99, may be replaced with a new collector mirror (not shown) during any of the first, second, and third operational modes.

The EUV laser 70 has the benefit of reduced collector mirror service time as compared to a conventional EUV laser that only has one collector mirror. For example, servicing the single collector mirror of the conventional EUV laser may cause more than 12 hours of downtime each time the single collector mirror must be serviced, because the conventional EUV laser is inoperable when the single collector is serviced. However, servicing the collector mirrors 74-76 of the EUV laser 70 may cause less than 1 hour of downtime, because the EUV laser 70 has multiple collector mirrors 74-76 that may be moved to an inactive position where the collector mirrors 74-76 may be serviced without stopping operation of the EUV laser 70.

Further, the ability to rotate the collector mirrors 74-76 may decrease replacement time to less than 1 hour, because the collector mirrors 74-76 may be moved to inactive positions where the collector mirrors 74-76 may be replaced without stopping operation of the EUV laser 70. On the other hand, replacement of a collector mirror in a conventional EUV laser that only has a single collector mirror could take more than 24 hours. Further, in a conventional EUV laser having only a single collector mirror, the EUV laser is inoperable during the time that it takes to replace the single collector mirror.

The embodiments of FIGS. 1 and 2 show rotational movement of the collector mirror(s) about axes 28 and 95 respectively. In alternate embodiments, the collector mirrors 19, 75-76 shown in FIGS. 1 and 2 may be configured to move in other ways. In an alternate embodiment of the EUV laser 70 shown in FIG. 2, the collector mirrors 74-76 are replaced with collector mirrors that are lined up vertically along a plane that is perpendicular to the axis 28, and the drive mechanism 72 is replaced with a drive mechanism that supports the collector mirrors for linear vertical movement along the plane.

Although the control unit 38 of the embodiments shown in FIGS. 1 and 2 uses a predetermined amount of time as the criteria for determining when to rotate a collector mirror, in other embodiments, the control unit 38 may be replaced with a control unit that uses other predetermined criteria to determine when collector mirrors should rotate. For example, in the embodiment shown in FIG. 1, the control unit 38 may be replaced with a control unit that monitors surface 85, and sends a pulse to the drive mechanism 72 after a certain amount of byproduct has impinged upon the surface 85.

Figure 3:
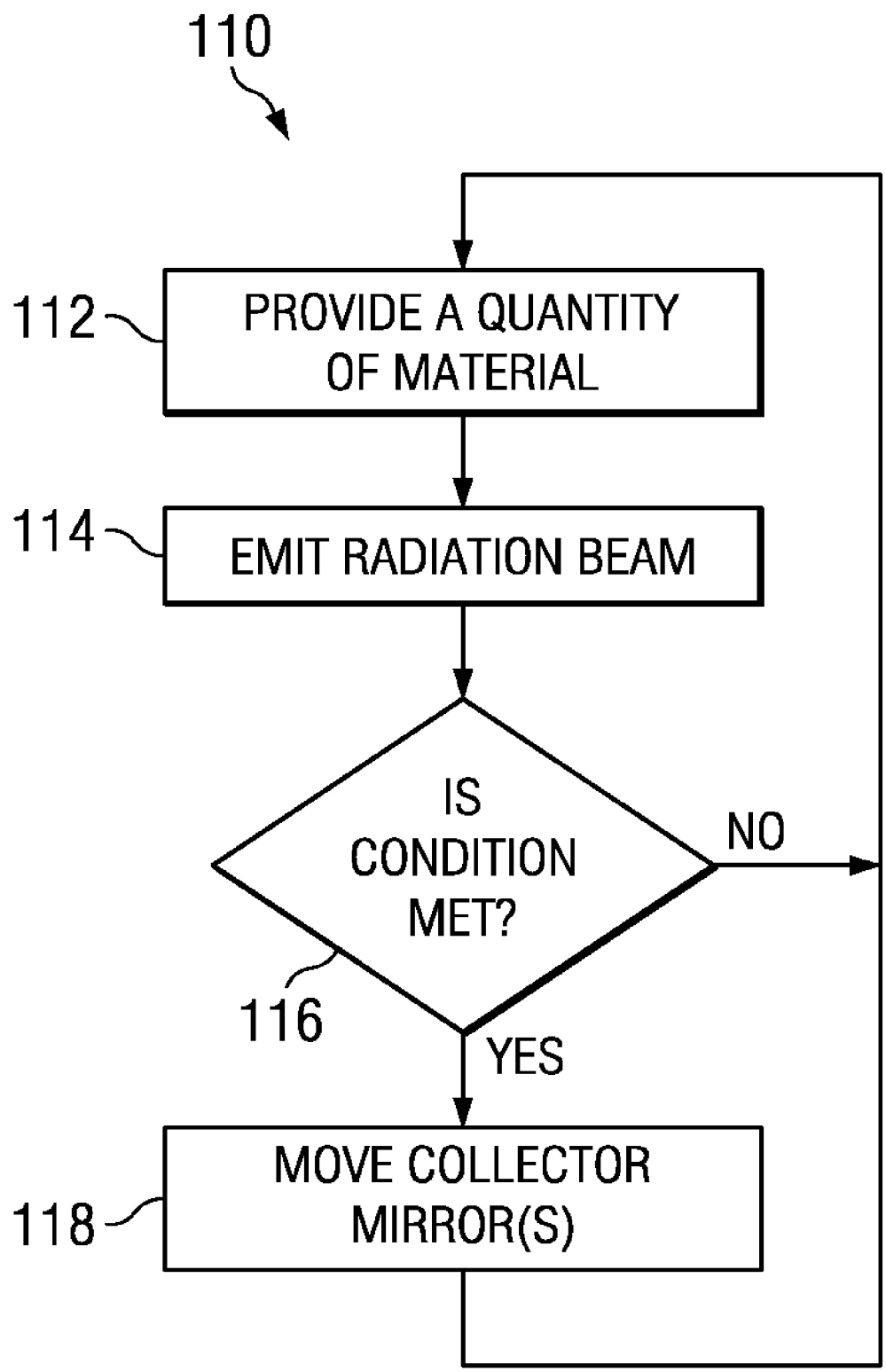
FIG. 3 is a flowchart that provides a high-level summary of the operation of each of the embodiments of FIGS. 1 and 2.

FIG. 3 is a flowchart that provides a high-level summary of the operation of each of the embodiments of FIGS. 1 and 2. A method 110 includes a block 112, at which a quantity of material 34 is provided by the material source 30 shown in FIG. 1. At block 114, a radiation pulse 13 is emitted by the $CO_2$ laser 12, and the radiation pulse 13 strikes the quantity of material 34 as described above in association with FIG. 1. At a decision block 116, the control unit 38 determines whether a predetermined amount of time has elapsed. If the pre-determined amount of time has not elapsed, then the method 110 returns to block 112. On the other hand, if the predetermined amount of time has elapsed, then the method 110 proceeds to block 118, wherein the collector mirror(s) is/are rotated. In the embodiment shown in FIG. 1, the collector mirror 19 is rotated about the axis 28. In the embodiment shown in FIG. 2, the collector mirrors 74-76 are rotated about the axis 95. After block 118, control returns to block 112.

One of the broader forms of the invention involves an apparatus having: a material source configured to provide a quantity of a material; a radiation source configured to emit a radiation beam that strikes the quantity of material, causing substantially all of the quantity of material to evaporate; and structure having first and second surface portions, and having first and second operational modes, wherein in the first operational mode a greater quantity of a byproduct of the evaporation impinges on the first surface portion than on the second surface portion, and in the second operational mode a greater quantity of the byproduct impinges on the second surface portion than on the first surface portion.

In another form, the radiation beam strikes the quantity of material at an impact location.

In another form, the radiation beam travels along a path that extends to the impact location, and the structure supports the first and second surface portions for movement relative to the impact location.

In another form, each of the first and second surface portions are reflective; upon striking the quantity of material, a portion of the radiation beam transforms into a radiation portion; in the first operational mode, the radiation portion radiates toward the first surface portion, and the first surface portion reflects the radiation portion; and in the second operational mode, the radiation portion radiates toward the second surface portion, and the second surface portion reflects the radiation portion.

In another form, the first surface portion is shaped so that in the first operational mode, the first surface portion focuses the reflection of the radiation portion toward a focal point; and In another form, the second surface portion is shaped so that in the second operational mode, the second surface portion focuses the reflection of the radiation portion toward the focal point.

In another form, the radiation beam has a first wavelength, and the radiation portion has a second wavelength that is different from the first wavelength.

In another form, the first and second surface portions are spaced from the path.

In another form, the structure further has a continuous surface that includes the first and second surface portions.

In another form, the continuous surface includes an aperture; and the path passes through the aperture of the continuous surface.

In another form, the structure supporting the first and second portions for movement is configured to rotate the continuous surface about an axis that is coincident with the path, the rotation being the movement relative to the impact location.

In another form, the structure further has separate first and second surfaces that respectively include the first and second surface portions.

In another form, each of the first and second surfaces includes an aperture;

In another form, in the first operational mode, the path passes through the aperture of the first surface, and the second surface is spaced from the path; and in the second operational mode, the path passes through the aperture of the second surface, and the first surface is spaced from the path.

In another form, the structure supporting the first and second portions for movement is configured to rotate the first and second surface portions about an axis that is transverse to the path, the rotation being the movement relative to the impact location.

In another form, the apparatus includes an extreme ultraviolet (EUV) lithography system having an EUV laser that includes the material source, the radiation source, and the structure.

According to another of the broader forms of the invention, a method includes: emitting a radiation beam toward a quantity of material; striking the quantity of material with the radiation beam, causing substantially all of the quantity of material to evaporate; operating a structure having first and second surface portions in a first operational mode in which a greater quantity of a byproduct of the evaporation impinges on the first surface portion than on the second surface portion; and thereafter operating the structure in a second operational mode in which a greater quantity of the byproduct impinges on the second surface portion than on the first surface portion.

In another form, the emitting is carried out in a manner that directs the radiation beam along a path that extends to an impact location; wherein the striking is carried out in a manner that causes the striking of the quantity of material with the radiation beam at the impact location; and the method further includes transitioning between the first and second operational modes, the transitioning including moving the first and second surface portions relative to the impact location.

In another form, each of the first and second surface portions are reflective; the striking is carried out in a manner that includes transforming the radiation beam into a radiation portion; further including reflecting the radiation portion using the first surface portion in the first operational mode; and reflecting the radiation portion using the second surface portion in the second operational mode.

In another form, the reflecting includes: focusing the travel of the radiation portion toward a focal point using the first surface portion in the first operational mode; and focusing the travel of the radiation portion toward the focal point using the second surface portion in the second operational mode.

In another form, the emitting is carried out in a manner such that the beam has a first wavelength; and the transforming is carried out in a manner such that the radiation portion has a second wavelength that is different from the first wavelength.

In another form, the structure further has a continuous surface that includes the first and second surface portions; and moving includes rotating the continuous surface about an axis that is coincident with the path.

In another form, the structure further has separate first and second surfaces that respectively include the first and second surface portions; and the moving is carried out in a manner that includes rotating the first and second surface portions about an axis that is transverse to the path.

Although only a few exemplary embodiments of this invention have been described in detail above, those skilled in the art will readily appreciate that many modifications are possible in the exemplary embodiments without materially departing from the novel teachings and advantages of this disclosure.

What is claimed is:

1. An apparatus, comprising:
    a material source configured to provide a quantity of a material;
    a radiation source configured to emit a radiation beam along an axis that strikes the quantity of material, causing substantially all of the quantity of material to evaporate; and
    a structure having first and second surface portions and configured to rotate the first and second surface portions about the axis, the structure having first and second operational modes, wherein in the first operational mode the structure rotates the first and second surface portions about the axis such that the first surface portion is positioned on a first side of the radiation beam and receives a greater quantity of a byproduct of the evaporation impinges than the second surface portion positioned on a second side of the radiation beam, and in the second operational mode the structure rotates the first and second surface portions about the axis such that the second surface portion is positioned on the first side of the radiation beam and receives a greater quantity of the byproduct impinges than the first surface portion positioned on the second side of the radiation beam.

2. An apparatus according to claim 1,
    wherein the radiation beam strikes the quantity of material at an impact location;
    wherein the radiation beam travels along a path that extends to the impact location; and
    wherein the structure supports the first and second surface portions for movement relative to the impact location.

3. An apparatus according to claim 2,
    wherein each of the first and second surface portions are reflective;
    wherein upon striking the quantity of material, a portion of the radiation beam transforms into a radiation portion;
    wherein in the first operational mode, the radiation portion radiates toward the first surface portion, and the first surface portion reflects the radiation portion; and
    wherein in the second operational mode, the radiation portion radiates toward the second surface portion, and the second surface portion reflects the radiation portion.

4. An apparatus according to claim 3,
    wherein the first surface portion is shaped so that in the first operational mode, the first surface portion focuses the reflection of the radiation portion toward a focal point; and
    wherein the second surface portion is shaped so that in the second operational mode, the second surface portion focuses the reflection of the radiation portion toward the focal point.

5. An apparatus according to claim 3, wherein in the radiation beam has a first wavelength, and the radiation portion has a second wavelength that is different from the first wavelength.

6. An apparatus according to claim 2, wherein the first and second surface portions are spaced from the path.

7. An apparatus according to claim 2, wherein the structure further has a continuous surface that includes the first and second surface portions.

8. An apparatus according to claim 7,
    wherein the continuous surface includes an aperture; and
    wherein the path passes through the aperture of the continuous surface.

9. An apparatus according to claim 8, wherein the structure supporting the first and second portions for movement is configured to rotate the continuous surface about the axis that is coincident with the path, the rotation being the movement relative to the impact location.

10. An apparatus according to claim 2, wherein the structure further has separate first and second surfaces that respectively include the first and second surface portions.

11. An apparatus according to claim 10,
    wherein each of the first and second surfaces includes an aperture;
    wherein in the first operational mode, the path passes through the aperture of the first surface, and the second surface is spaced from the path; and
    wherein in the second operational mode, the path passes through the aperture of the second surface, and the first surface is spaced from the path.

12. An apparatus according to claim 11, wherein the structure supporting the first and second portions for movement is configured to rotate the first and second surface portions about an axis that is transverse to the path, the rotation being the movement relative to the impact location.

13. An apparatus according to claim 1, wherein the apparatus includes an extreme ultraviolet (EUV) lithography system having an EUV laser that includes the material source, the radiation source, and the structure.

14. A method, comprising:
    emitting a radiation beam along an axis toward a quantity of material;
    striking the quantity of material with the radiation beam, causing substantially all of the quantity of material to evaporate;
    operating a structure having first and second surface portions in a first operational mode, wherein the first operational mode includes rotating the first and second surface portions about the axis such that the first surface portion is positioned on a first side of the radiation beam and receives a greater quantity of a byproduct of the evaporation impinges than the second surface portion positioned on a second side of the radiation beam; and
    thereafter operating the structure in a second operational mode, wherein the second operational mode includes rotating the first and second surface portions about the axis such that the second surface portion is positioned on the first side of the radiation beam and receives a greater quantity of the byproduct impinges than the first surface portion positioned on the second side of the radiation beam.

15. A method according to claim 14,
    wherein the emitting is carried out in a manner that directs the radiation beam along a path that extends to an impact location;

wherein the striking is carried out in a manner that causes the striking of the quantity of material with the radiation beam at the impact location; and further including transitioning between the first and second operational modes, the transitioning including moving the first and second surface portions relative to the impact location.

16. A method according to claim 15, wherein each of the first and second surface portions are reflective;

wherein the striking is carried out in a manner that includes transforming the radiation beam into a radiation portion;

further including reflecting the radiation portion using the first surface portion in the first operational mode; and reflecting the radiation portion using the second surface portion in the second operational mode.

17. A method according to claim 16, wherein the reflecting includes:

focusing the travel of the radiation portion toward a focal point using the first surface portion in the first operational mode; and focusing the travel of the radiation portion toward the focal point using the second surface portion in the second operational mode.

18. A method according to claim 16, wherein the emitting is carried out in a manner such that the beam has a first wavelength; and wherein the transforming is carried out in a manner such that the radiation portion has a second wavelength that is different from the first wavelength.

19. A method according to claim 15, wherein the structure further has a continuous surface that includes the first and second surface portions; and wherein the moving includes rotating the continuous surface about the axis that is coincident with the path.

20. A method according to claim 15, wherein the structure further has separate first and second surfaces that respectively include the first and second surface portions; and wherein the moving is carried out in a manner that includes rotating the first and second surface portions about an axis that is transverse to the path.

\* \* \* \* \*